United States Patent [19]

Chu et al.

[11] Patent Number: 4,812,688
[45] Date of Patent: Mar. 14, 1989

[54] TRANSISTOR DELAY CIRCUITS

[75] Inventors: Albert M. Chu, Essex Junction; William R. Griffin, Shelburne, both of Vt.

[73] Assignee: International Business Machines Corporation, Armonk, N.Y.

[21] Appl. No.: 139,551

[22] Filed: Dec. 30, 1987

[51] Int. Cl.[4] .................. H03K 5/04; H03K 3/017; H03K 17/687; H03K 17/284
[52] U.S. Cl. .................. 307/605; 307/602; 307/594; 307/585; 307/451; 307/242; 328/56
[58] Field of Search .............. 307/602, 603, 605, 606, 307/607, 303, 304, 262, 594, 600, 601, 242, 585, 451, 576, 579, 580, 585, 571, 241, 242, 243, 496, 644, 257; 328/56, 55, 127; 357/42

[56] References Cited

U.S. PATENT DOCUMENTS

| | | | |
|---|---|---|---|
| 4,074,151 | 2/1987 | Buckley, III et al. | 307/304 |
| 4,388,538 | 6/1983 | Ikeda | 307/482 |
| 4,430,587 | 2/1984 | Tennyson | 307/590 |
| 4,473,761 | 9/1984 | Peterson | 307/585 |
| 4,476,401 | 10/1984 | Lin | 307/269 |
| 4,508,983 | 4/1985 | Allgood et al. | 307/579 |
| 4,511,814 | 4/1985 | Matsuo | 307/572 |
| 4,516,312 | 5/1985 | Tomita | 29/571 |
| 4,551,634 | 11/1985 | Takaheshi et al. | 307/243 |
| 4,694,205 | 9/1987 | Shu et al. | 307/605 |
| 4,700,089 | 10/1987 | Fujii et al. | 307/605 |

Primary Examiner—Stanley D. Miller
Assistant Examiner—Huy Kim Mai
Attorney, Agent, or Firm—Stephen J. Limanek

[57] ABSTRACT

A signal delay circuit is provided which includes first and second circuits arranged parallel to each other, the first circuit having serially connected first and second transistors and the second circuit having a third transistor, and a fourth transistor connected from the common point between the first and second transistors to the second circuit, a signal is applied to one end of the parallelly arranged first and second circuits while the first, second and fourth transistors are turned on with the third transistor being turned off.

23 Claims, 3 Drawing Sheets

TRANSISTOR DELAY CIRCUITS

TECHNICAL FIELD

This invention relates to field effect transistor (FET) delay circuits and, more particularly, to complementary metal oxide semiconductor (CMOS) FET delay circuits of the integrated circuit type which may be formed in a semiconductor substrate, such as silicon.

BACKGROUND ART

At times it is desired to delay signals, such as binary logic signals, for timing considerations, such as race conditions caused by high speed circuits or paths, skewing of off-chip driver switching to reduce power bus noise, or other such reasons.

Circuits for producing signal delay are well known in the prior art. One known type of signal delay circuit is the basic resistor-capacitor or RC circuit. This type of delay circuit is disclosed in, e.g., U.S. Pat. No. 4,430,587, filed Jan. 13, 1982, entitled "MOS FIXED DELAY CIRCUIT", and U.S. Pat. No. 4,516,312, filed Feb. 10, 1982, entitled "METHOD FOR CONSTRUCTING DELAY CIRCUITS IN A MASTER SLICE IC". Another known type of delay circuit is implemented by an inverter or a series of inverters as disclosed in, e.g., U.S. Pat. No. 4,476,401, filed Jan. 31, 1983, entitled "WRITE STROBE GENERATOR FOR CLOCK SYNCHRONIZED MEMORY", and U.S. Pat. No. 4,700,089, filed Aug. 20, 1985, entitled "DELAY CIRCUIT FOR GATE-ARRAY LSI". A further known type of delay circuit is disclosed in U.S. Pat. No. 4,388,538, filed Sept. 29, 1980, entitled "DELAY SIGNAL GENERATING CIRCUIT", which is implemented in N-channel field effect transistor or NMOS technology and which uses a bootstrap operation and depletion devices. Although not designed as a signal delay circuit, U.S. Pat. No. 4,511,814, filed Nov. 29, 1982, entitled "SEMICONDUCTOR ANALOG SWITCH CIRCUIT WITH COMPENSATION MEANS TO MINIMIZE OFFSET OF CIRCUIT VOLTAGE", discloses a circuit having a pass gate or, more particularly, parallelly connected CMOS transistors, through which signals pass from an input terminal to an output terminal.

Disclosure of the Invention

It is an object of this invention to provide an improved signal delay circuit which uses minimal surface area on a semiconductor substrate or chip and minimal power, yet which is expandable for selectable and various amounts of time delays, while reducing testability concerns.

In accordance with the teachings of this invention, a delay circuit is provided which includes first and second circuits arranged parallel to each other, the first circuit having serially connected first and second transistors and the second circuit having a third transistor, and a fourth transistor connected from the common point between the first and second transistors to the second circuit, a signal is applied to one end of the parallelly arranged first and second circuits while the first, second and fourth transistors are turned on with the third transistor being turned off. In a more specific embodiment of this invention, the delay circuit includes first and second circuits arranged parallel to each other, the first circuit having serially connected first and second transistors of a given type conductivity and the second circuit having a third transistor of a conductivity type opposite to that of the given type conductivity, a fourth transistor connected from the common point between the first and second transistors to the second circuit, means for applying a given signal to one end of the parallelly arranged first and second circuits, and means for applying a signal which is the complement of the given signal to the control electrodes of the transistors.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
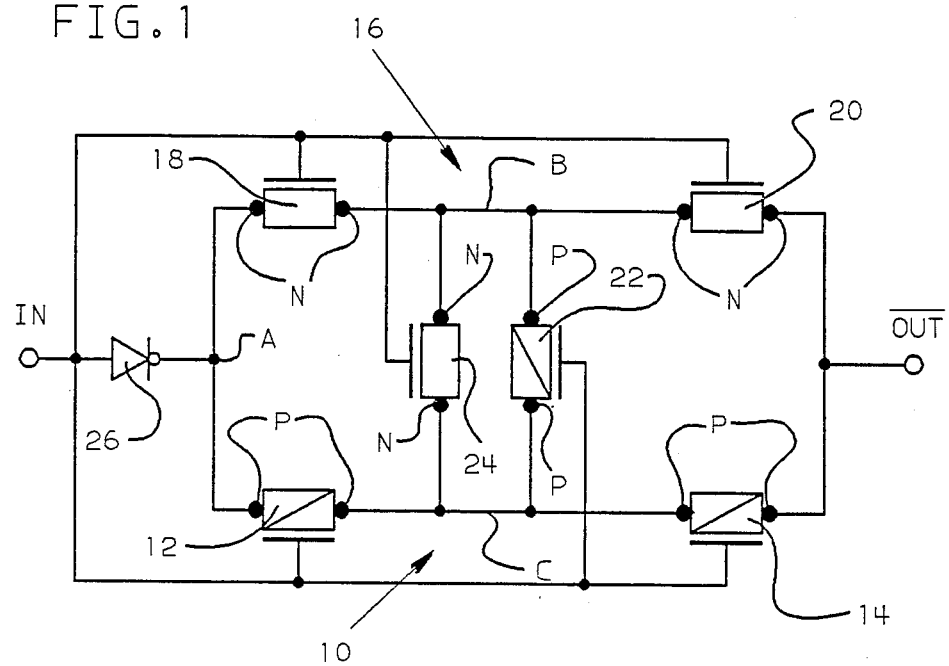
FIG. 1 is a circuit diagram of a preferred embodiment of the present invention.

Referring to FIG. 1 of the drawings in more detail, there is shown a circuit diagram of a preferred embodiment of the CMOS FET delay circuit of the present invention. The circuit, being made in the CMOS technology, has its P-channel field effect transistors indicated by a rectangle with a diagonal line formed therein and a gate electrode arranged adjacent thereto and its N-channel field effect transistors indicated by a rectangle without a diagonal line and a gate electrode arranged adjacent thereto.

The CMOS FET delay circuit of the present invention illustrated in FIG. 1 includes a first series circuit 10 having first and second field effect transistors 12 and 14, respectively, of the P-channel type connected between a first node A and an output terminal $\overline{OUT}$ and a second series circuit 16 having third and fourth field effect transistors 18 and 20, respectively, of the N-channel type connected between the first node A and the output terminal $\overline{OUT}$. A second node B is located at the common point between the third and fourth N-channel transistors 18 and 20 and a third node C is located at the common point between the first and second transistors 12 and 14. A fifth field effect transistor 22 of the P-channel type is connected between node B and node C, and a sixth field effect transistor 24 of the N-channel type is also connected between node B and node C.

P-type diffusions, preferably P+, are indicated by P for the source/drain regions of the P-channel transistors 12, 14 and 22, and N-type diffusions, preferably N+, are indicated by N for the source/drain regions of the N-channel transistors 18, 20 and 24, which will be discussed in more detail hereinbelow.

An input terminal IN is provided for receiving an input signal such as a binary logic signal which is connected to each of the control electrodes of the transistors 12, 14, 18, 20, 22 and 24. An inverter 26 of preferably any known CMOS type is connected between the input terminal IN and the first node A.

Figure 2:
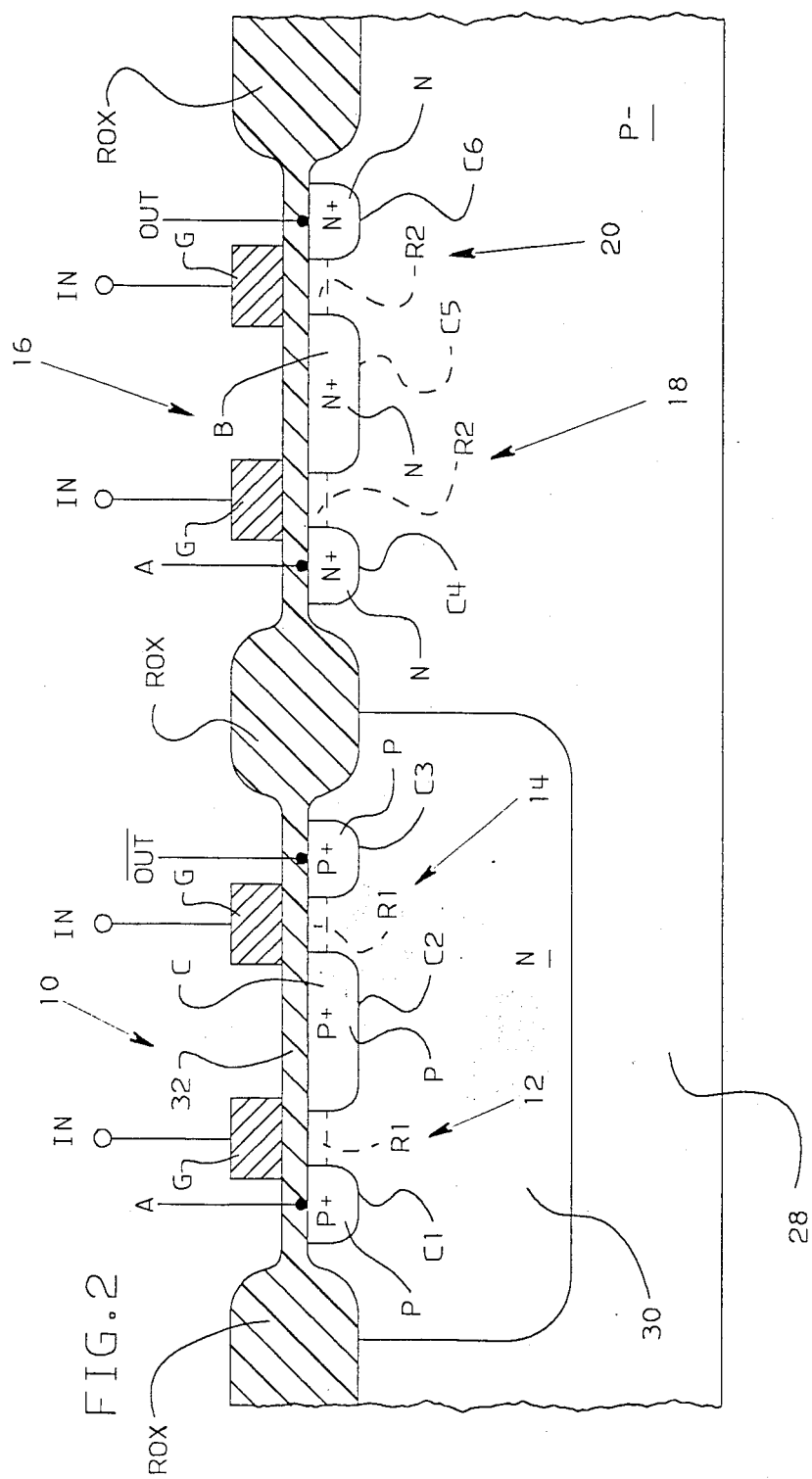
FIG. 2 illustrates a cross-sectional view taken through a silicon substrate of a first series circuit of P-channel transistors and of a second series circuit of N-channel transistors used in the circuit of FIG. 1.

In FIG. 2 of the drawings there is illustrated a cross-sectional view of the P-channel transistors 12 and 14 and the N-channel transistors 18 and 20 shown in FIG. 1 taken through a silicon substrate 28 having a P-type conductivity. Elements in FIG. 2 which are similar to corresponding elements in FIG. 1 are provided with the same reference characters. As shown in FIG. 2 the substrate 28 includes an N-well 30 with a thin layer of silicon dioxide 32 formed on the surface thereof. Recessed oxide regions ROX are disposed at the edges of the N-well to electrically isolate the N-well from the remainder of the substrate, as is well known. As can be seen in FIG. 2, the first and second P-channel transistors 12 and 14 are formed in the N-well 30. Transistor 12 includes the P-type diffusions P of the source/drain regions forming capacitive or P-N junctions with the N-type conductivity N-well 30 identified as capacitors C1 and C2, and transistor 14 includes the P-type diffusions P of the source/drain regions forming capacitive or P-N junctions with the N-type conductivity N-well 30 identified as capacitor C3 and the capacitor C2, which is common to both transistors 12 and 14. Control or gate electrodes for the transistors 12 and 14 are indicated at G. As is known, the impurity used for the P-type diffusions may be boron.

The N-channel transistors 18 and 20 are formed at the surface of the substrate 28 outside of the N-well 30. The transistor 18 includes the N-type diffusions N of the source/drain regions forming capacitive or P-N junctions with the P-type conductivity silicon substrate 28 identified as capacitors C4 and C5, and transistor 20 includes the N-type diffusions N of the source/drain regions forming capacitive or P-N junctions with the P-type conductivity silicon substrate 28 identified as capacitor C6 and the capacitor C5, which is common to both transistors 18 and 20. Control or gate electrodes for the transistors 18 and 20 are indicated at G. As is known, the impurity used for the N-type diffusions may be arsenic or phosphorous.

As is also known, the region below the gate electrodes at the surface of the semiconductor substrate between the source/drain regions of the transistors 12, 14, 18 and 20 is the channel region which when inverted permits electrical conduction between the node A and the terminal $\overline{OUT}$. Thus, when the P-channel transistors 12 and 14 are turned on current flows between node A and the output terminal $\overline{OUT}$ through a resistive path indicated as R1 which includes the P-channel transistors 12 and 14, as can be seen in FIG. 2 of the drawings, and when the N-channel transistors 18 and 20 are turned on current flows between node A and the output terminal $\overline{OUT}$ through a resistive path indicated as R2 which includes the N-channel transistors 18 and 20.

Figure 3:
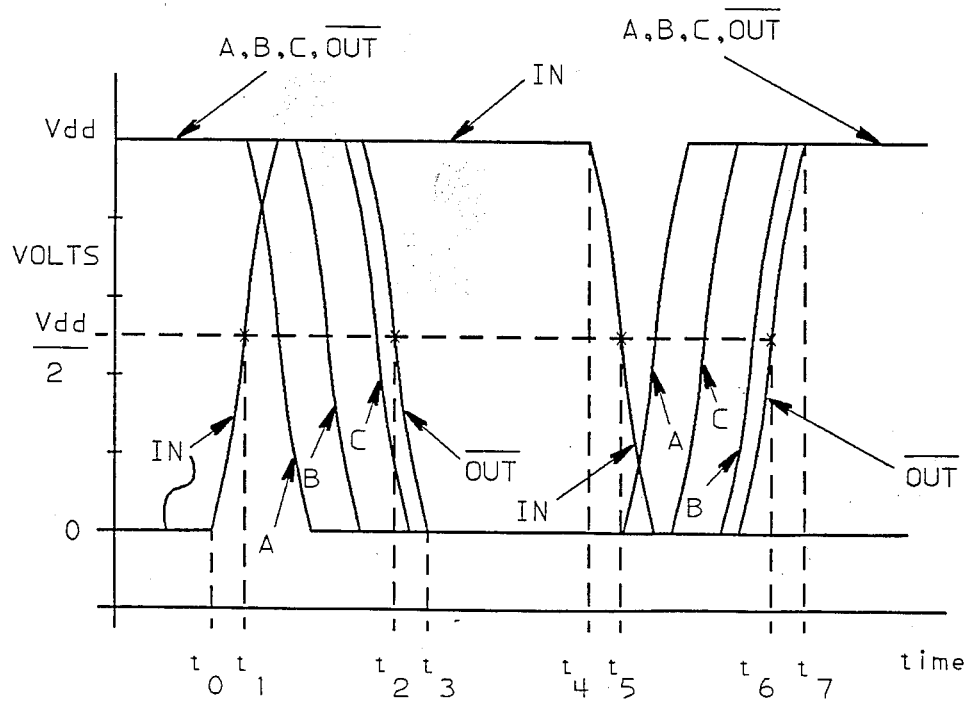
FIG. 3 is a pulse program of the voltages at various points or nodes in the circuit of FIG. 1 plotted against time.

In order to better understand the operation of the invention, reference may be had to the pulse program shown in FIG. 3 of the drawings along with the circuit diagram of FIG. 1 and the cross-sectional view of FIG. 2. As can be seen from the graph of FIG. 3, wherein voltage is plotted against time at the input terminal IN, the output terminal $\overline{OUT}$ and the nodes A,B and C, when the voltage at terminal IN is at 0 volts, the voltage at the nodes A, B and C and at terminal $\overline{OUT}$ is at Vdd or 5 volts, since each of these points of the delay circuit are connected to the output of the inverter 26. At time $t_0$, the voltage begins to rise toward Vdd and when at time $t_1$ it reaches Vdd/2, the approximate switch point of the inverter 26, the voltage at the output of the inverter 26, i.e., at node A, will begin to fall due to the discharge of node A through the inverter 26. Since the voltage at node A is falling and the voltage at the control electrodes of the N-channel transistors 18 and 20 is rising, the voltage at node B also begins to fall due to the turn on of the transistor 18. With the voltage at node B continuing to fall and the voltage at the input terminal IN continuing to rise, the N-channel transistors 20 and 24 turn on to drop the voltage at the output terminal $\overline{OUT}$ and at node C, as indicated in FIG. 3. At time $t_2$, the voltage at the output terminal $\overline{OUT}$ falls to Vdd/2, with the delay in the signal from the input terminal IN to the output terminal $\overline{OUT}$ being equal to time $t_2$ minus time $t_1$. The voltage at the output terminal $\overline{OUT}$ thereafter falls to 0 volts at time $t_3$, with the voltage at the input terminal IN being at Vdd volts.

At time $t_4$, the voltage at the input terminal IN is lowered toward 0 volts, with the input voltage being at Vdd/2 at time $t_5$. At time $T_5$, the voltage at node A begins to rise due to the charge received from the inverter 26. With the rise of the voltage at node A and the fall of the voltage at the input terminal IN, the P-channel transistor 12 turns on to begin charging up node C. With charge accumulating on node C, P-channel transistors 14 and 22 turn on to begin charging the output terminal $\overline{OUT}$ and the node B. At time $t_6$, the voltage at the output terminal reaches a value of Vdd/2 and at time $t_7$ the output voltage is the full power supply voltage of Vdd volts.

It should be noted that depending upon the characteristics of the circuit, especially of the P-channel transistors 14 and 22, the voltage at node B could rise sooner or later than that of the output terminal $\overline{OUT}$, or simultaneously therewith. Likewise, depending upon the characteristics of the circuit, especially of the N-channel transistors 20 and 24, the voltage at node C could fall sooner or later than that of the output terminal $\overline{OUT}$ between the times $t_1$ and $t_3$. It should be noted further that the fall delay and the rise delay of the output voltage may, if desired, be made unequal by merely altering the characteristics of the transistors in the two different paths, i.e., the RC time constant produced by resistive path R1 and capacitors C1, C2 and C3 in the series circuit which includes P-channel transistors 12 and 14 may be made different from the RC time constant produced by resistive path R2 and capacitors C4, C5 and C6 in the series circuit which includes N-channel transistors 18 and 20. It should also be noted that the addition of the P-channel transistor 22 and the N-channel transistor 24 significantly increases the capacitance of the two paths between the node A and the output terminal $\overline{OUT}$ by adding the capacitance at node B and node C, respectively. Furthermore, by using transistors 22 and 24, node C and node B, respectively, are reset to insure maximum delay at the next transition of the signal. It is known that the capacitance values of the capacitors of the circuit, such as capacitors C1, C2, C3, C4, C5 and C6, and the resistance values of resistors R1 and R2 may be altered by using various impurities as well as different concentrations thereof in the substrate, especially in the source/drain regions, or by altering the sizes of the various elements in the circuit, e.g., using different beta ratios, i.e., transistor channel width to length ratios. Thus, if desired, the rising delay of the signal, or voltage at the output terminal may be made longer or shorter than that of the falling delay, or they may be made equal to each other, i.e., the rising delay, time $t_6$ minus time $t_5$, may be equal to the falling delay, time $t_2$ minus time $t_1$, taken at the voltage level Vdd/2, the effective switch point of the transistors, as indicated in FIG. 3 of the drawings.

Figure 4:
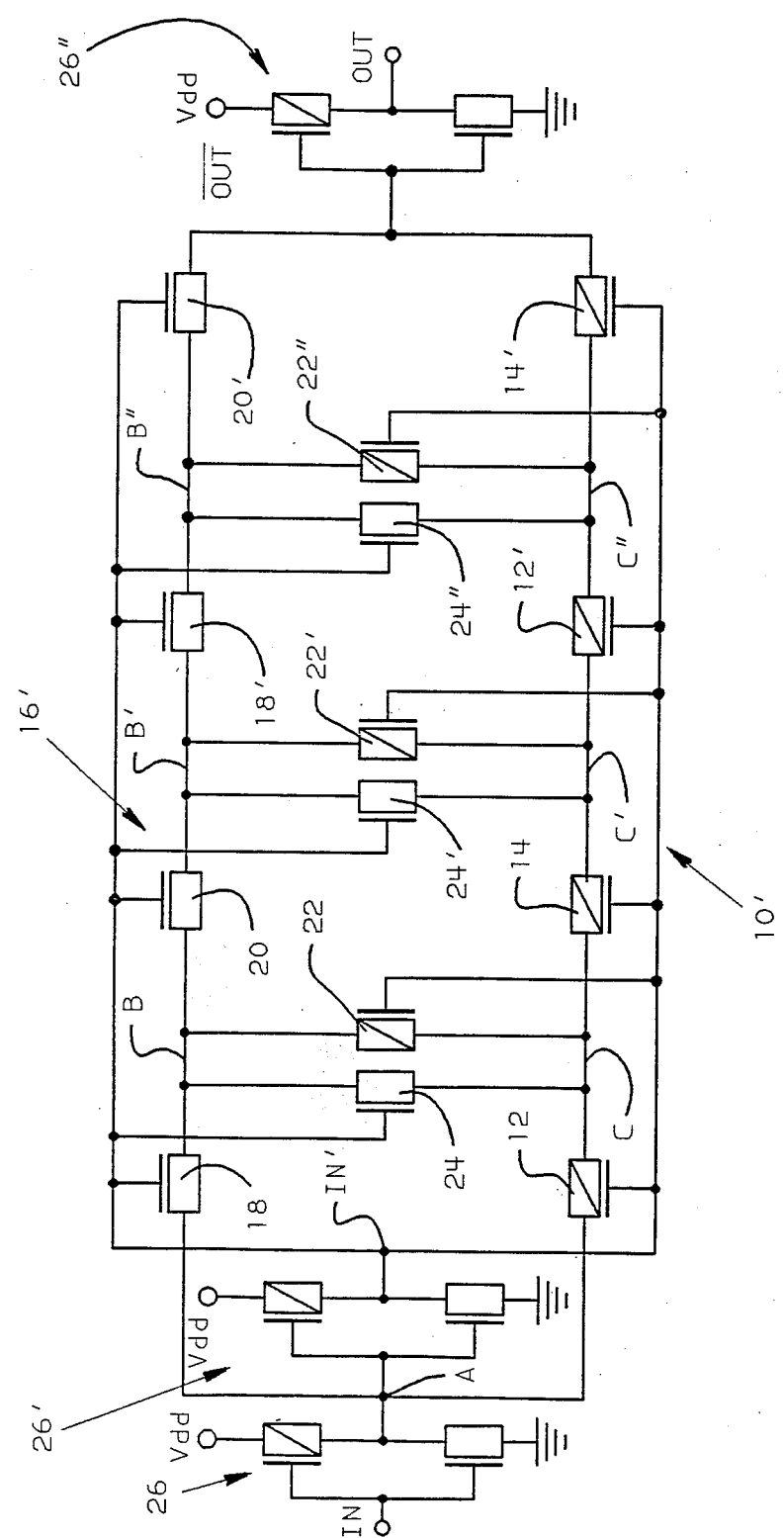
FIG. 4 is a circuit diagram similar to that of FIG. 1 but with additional buffers and stages which provides an expanded non-inverted output signal delay.

To provide a non-inverting delay circuit in accordance with the teachings of this invention as well as a longer delay period, the embodiment illustrated in FIG. 4 may be used. In the circuit of FIG. 4 elements similar to those of the circuit of FIG. 1 have been identified with the same reference characters. The signal delay circuit of FIG. 4 includes a first series circuit having the P-channel transistors 12 and 14 and added P-channel transistors 12' and 14' connected between the node A and the output terminal $\overline{OUT}$ and a second series circuit having the N-channel transistors 18 and 20 and added N-channel transistors 18° and 20' also connected between the node A and the output terminal $\overline{OUT}$. Node B' is located at the common point between the N-channel transistors 20 and 18' and node B" is located at the common point between N-channel transistors 18' and 20'. Node C' is located at the common point between P-channel transistors 14 and 12' and node C" is located at the common point between transistors 12' and 14' A P-channel transistor 22' is connected between nodes B' and C' and an N-channel transistor 24' is also connected between nodes B' and C'. A P-channel transistor 22" is connected between nodes B" and C" and an N-channel transistor 24" is also connected between nodes B" and C".

The signal delay circuit of FIG. 4 also includes a second inverter 26' having an input connected to the node A and an output connected to a terminal IN' which is connected to the control or gate electrodes of each of the transistors connected between the node A and the output terminal $\overline{OUT}$. A higher driving voltage is provided by connecting these control electrodes to the output of the second inverter 26' than to the input terminal IN. A third inverter 26" having an input connected to the output terminal $\overline{OUT}$ and an output connected to an output terminal OUT is provided to produce a non-inverted output signal. It should be understood that additional stages of delay in accordance with the teaching of this invention may be inserted between the node A and the output terminal $\overline{OUT}$ if even longer delay times are required.

The circuit of FIG. 4 operates in the same manner as that of FIG. 1 except that additional stages have been provided to increase the RC time constant of the circuit.

It should be noted that the signal delay circuit of the present invention provides an output voltage which swings between full supply voltage Vdd and ground in view of the use of the P-channel transistors for charging the output terminal $\overline{OUT}$ and the use of the N-channel transistors for discharging the output terminal It can be seen that a signal delay circuit has been disclosed which requires only one inverter and, therefore, uses minimal switching power, up to 50% less power per unit delay, and which can be made within a very small surface area of the semiconductor substrate per nanosecond of delay due to the arrangement of the CMOS transistors in the circuit, up to two times more delay per unit area. Furthermore, the delay circuit, which is very useful in an automated design environment, is readily expandable to provide desired delay periods, while reducing testability concerns since only one path, i.e., the N-channel device path or the P-channel device path, conducts in a cycle to more readily detect fault mechanisms. Also, this delay circuit provides flexible implementation of asymmetric delay between the rise delay and fall delay of the input signal.

While the invention has been particularly shown and described with reference to preferred embodiments thereof, it will be understood by those skilled in the art that various changes in form and details may be made therein without departing from the spirit and scope of the invention.

What is claimed is:

1. A signal delay circuit comprising
   an input terminal,
   an output terminal,
   first and second circuits arranged parallel to each other and disposed between said input and output terminals, said first circuit having serially connected first and second transistors and said second circuit having a third transistor,
   a fourth transistor connected from the common point between said first and second transistors to said second circuit,
   means for applying a signal to said parallelly arranged first and second circuits,
   turning on said first, second and fourth transistors, and means for selectively turning on said third transistor.

2. A signal delay circuit as set forth in claim 1 wherein said first, second and fourth transistors are N-channel field effect transistors and said third transistor is a P-channel field effect transistor.

3. A signal delay circuit as set forth in claim 1 wherein said first, second and fourth transistors are P-channel field effect transistors and said third transistor is an N-channel field effect transistor.

4. A signal delay circuit as set forth in claim 2 further including an inverter having an input and an output, said signal being derived from the output of said inverter and said turning on means being connected to the input of said inverter.

5. A signal delay circuit as set forth in claim 1 wherein said fourth transistor is connected to said second circuit at a point between said third transistor and said output terminal.

6. A signal delay circuit as set forth in claim 5 wherein said second circuit has a fifth transistor serially connected with said third transistor and said fourth transistor is connected to said second circuit at a common point between said third and fifth transistors.

7. A signal delay circuit comprising
   first and second circuits coupled in parallel to each other, said first circuit having serially connected first and second transistors of a given type conductivity and said second circuit having a third transistor of a conductivity type opposite to that of said given type conductivity,
   a fourth transistor connected from the common point between said first and second transistors to said second circuit,
   means for applying a given signal to said first and second circuits, and
   means for applying a signal which is the complement of said given signal to the control electrodes of said transistors.

8. A signal delay circuit as set forth in claim 7 wherein said first, second and fourth transistors are N-channel field effect transistors and said third transistor is a P-channel field effect transistor.

9. A signal delay circuit as set forth in claim 7 wherein said first, second and fourth transistors are P-channel field effect transistors and said third transistor is an N-channel field effect transistor.

10. A signal delay circuit as set forth in claim 5 further including a first inverter having an input and an output, said signals being derived from the input and output of said inverter.

11. A signal delay circuit as set forth in claim 10 wherein the output of said inverter is coupled to said first and second circuits and the input of said inverter is coupled to the control electrodes of said transistors.

12. A signal delay circuit as set forth in claim 10 wherein the input of said inverter is coupled to said first and second circuits and the output of said inverter is coupled to the control electrodes of said transistors.

13. A signal delay circuit as set forth in claim 12 further including an input terminal and a second inverter having an input and an output, the input of said second inverter being connected to said input terminal and the output of said second inverter being connected to the input of said first inverter.

14. A signal delay circuit as set forth in claim 13 further including an output terminal and a third inverter having an input and an output, said first and second circuits being connected at one end to the input of said first inverter and at the other end to the input of said third inverter, the output of said third inverter being connected to said output terminal.

15. A signal delay cirucit as set forth in claim 14 wherein said inverters include P-channel and N-channel field effect transistors.

16. A signal delay circuit comprising
first and second circuits connected in parallel with each other, said first circuit including serially connected first and second transistors of a given type conductivity and said second circuit including serially connected third and fourth transistors of a conductivity type opposite to that of said given type conductivity,
a fifth transistor of said given type conductivity connected from the common point between said first and second transistors to the common point between said third and fourth transistors,
a sixth transistor of said opposite type conductivity connected from the common point between said first and second transistors to the common point between said third and fourth transistors,
means for applying a given signal to said parallelly arranged first and second circuits, and
means for applying a signal which is the complement of said given signal to the control electrodes of said transistors.

17. A signal delay circuit as set forth in claim 16 wherein said first, second and fifth transistors are N-channel field effect transistors and said third, fourth and sixth transistors are P-channel field effect transistors.

18. A signal delay circuit as set forth in claim 15 including an inverter having an input and an output, said signals being derived from the input and output of said inverter.

19. A signal delay circuit as set forth in claim wherein the output of said inverter is coupled to said parallelly arranged first and second circuits and the input of said inverter is coupled to the control electrodes of said transistors.

20. A signal delay circuit as set forth in claim 18 wherein the input of said inverter is coupled to said first and second circuits and the output of said inverter is coupled to the control electrodes of said transistors.

21. A signal delay circuit as set forth in claim 16 wherein said first circuit has a first resistance having a first value and said second circuit has a second resistance having a second value which differs from that of the first value, and each of said transistors is a field effect transistor having source/drain regions forming a capacitive P-N junction with a semiconductor substrate, said P-N junctions forming a first capacitor having a first value when said transistors of said given type conductivity are turned on and said P-N junctions forming a second capacitor having a second value when said transistors of said opposite type conductivity are turned on which differs from said first capacitor value.

22. A signal delay circuit comprising
an input terminal,
an output terminal,
a first series circuit including first and second N-channel field effect transistors having a first common node therebetween connected between said input and output terminals,
a third N-channel field effect transistor having one end thereof including said first common node, said first common node being an N-type conductivity diffusion region forming a P-N junction with a P-type semiconductor substrate,
a second series circuit including first and second P-channel field effect transistors having a second common node therebetween connected between said input and output terminals,
a third P-channel field effect transistor having one end thereof including said second common node, said second common node being a P-type conductivity diffusion region forming a P-N junction with an N-type semiconductor substrate,
means for connecting the other end of said third P-channel transistor to said first common node and for connecting the other end of said third N-channel transistor to said second common node,
means for applying a given signal to said input terminal, and
means for applying a signal which is the complement of said given signal to the control electrodes of said transistors.

23. A signal delay circuit as set forth in claim 22 wherein said N-type semiconductor substrate is an N-well disposed within a P-type semiconductor substrate.

* * * * *